United States Patent [19]

Besen et al.

[11] Patent Number: 5,501,740
[45] Date of Patent: Mar. 26, 1996

[54] MICROWAVE PLASMA REACTOR

[75] Inventors: Matthew M. Besen, Tewksbury; Evelio Sevillano, Lexington; Donald K. Smith, Arlington, all of Mass.

[73] Assignee: Applied Science and Technology, Inc., Woburn, Mass.

[21] Appl. No.: 219,208

[22] Filed: Mar. 29, 1994

Related U.S. Application Data

[63] Continuation-in-part of Ser. No. 72,272, Jun. 4, 1993.
[51] Int. Cl.$^6$ ................................................. C23C 16/00
[52] U.S. Cl. .................... 118/723 MP; 118/723 MW; 118/723 ME; 118/723 MR; 156/345; 204/298.38
[58] Field of Search ......................... 118/719, 723 MP, 118/723 MW, 723 ME, 723 MR, 723 MA, 723 AN, 723 E, 723 ER, 724, 725; 156/345; 204/298.38; 315/111.21

[56] References Cited

U.S. PATENT DOCUMENTS

| | | |
|---|---|---|
| 4,265,730 | 5/1981 | Hirose et al. . |
| 4,339,326 | 7/1982 | Hirose et al. . |
| 4,630,566 | 12/1986 | Asmussen et al. . |
| 4,767,608 | 8/1988 | Matsumoto et al. . |
| 4,919,077 | 4/1990 | Oda et al. ................ 118/723 MP |
| 4,940,015 | 7/1990 | Kobashi et al. . |
| 4,989,542 | 2/1991 | Mutsukazu . |
| 5,034,086 | 7/1991 | Sato . |
| 5,061,838 | 10/1991 | Lane et al. . |
| 5,078,851 | 1/1992 | Nishihata et al. . |
| 5,131,992 | 7/1992 | Church et al. . |
| 5,284,544 | 2/1994 | Mizutani et al. .......... 118/723 MW X |
| 5,342,472 | 8/1994 | Imahashi et al. .................. 156/345 |

FOREIGN PATENT DOCUMENTS

| | | |
|---|---|---|
| 62-218575 | 9/1987 | Japan . |
| 64-46916 | 2/1989 | Japan ................ 118/723 MP |
| 1-109699 | 4/1989 | Japan . |
| 2-27776 | 11/1990 | Japan . |
| 2-277776 | 11/1990 | Japan ................ 118/723 MP |

OTHER PUBLICATIONS

Smith, Donald K., "Design and Operation of a 12 CM Diameter, 750 Watt Microwave Plasma Source," Thesis submitted at University of Wisconsin–Madison–1976, pp. 1–29.

Primary Examiner—R. Bruce Breneman
Assistant Examiner—Joni Y. Chang
Attorney, Agent, or Firm—Testa, Hurwitz & Thibeault

[57] ABSTRACT

A microwave plasma reactor including a chamber for containing a gas to be energized into a plasma with microwave energy, an electrode having two surfaces in the chamber for radiating microwave energy from one of the surfaces into the chamber to form the plasma proximate the radiating surface, and a waveguide or coaxial conductor for introducing microwave energy onto the other of the two electrode surfaces for providing the energy to form the plasma.

41 Claims, 4 Drawing Sheets

MICROWAVE PLASMA REACTOR

RELATED APPLICATION

This application is a continuation-in-part of U.S. patent application Ser. No. 08/072,272, filed Jun. 4, 1993, entitled "Microwave Plasma Reactor", by the same inventors.

FIELD OF INVENTION

This invention relates to a microwave plasma reactor that is particularly adapted to form an enlarged symmetric plasma for symmetrically processing large substrates.

BACKGROUND OF INVENTION

Microwave-generated plasmas are used in many deposition, etching and substrate processing operations. Microwave plasma reactors typically include a vacuum chamber containing a gas to be energized to form the plasma. Microwave energy is introduced to the chamber through a dielectric window or dielectric barrier to maintain the vacuum in the processing chamber while providing a means of allowing the microwave energy to enter the chamber. The vacuum chamber may include the microwave cavity or the vacuum chamber and cavity may be separate volumes that may intersect or overlap.

Such microwave devices, however, suffer from a number of problems which have kept them from being widely accepted for industrial processing applications. The need to carefully place and seal the dielectric window creates difficult to disassemble devices that do not lend themselves to the easy substrate access required for industrial applications in which speed and ease is critical. Further, the dielectric window is exposed to the plasma. Since the windows cannot be subjected to the high temperature levels required for plasma operation, it is necessary to design the chambers so that the plasma does not touch the window. However, this limits the amount of power that can be coupled to the plasma, because plasma size is directly related to power for a given pressure. Further, the plasma tends to etch the window, thereby slowly destroying it. Additionally, this etching causes contamination of the chamber and the substrate with the dielectric window material. Also, the plasma may deposit a deleterious coating on the window which may limit its useful life.

These microwave plasma generators also require that the plasma vacuum chamber be relatively small so that a plasma may be formed with available power. Since plasma temperatures may reach 1000° C. or more, the heat load on the chamber walls is extremely high, requiring complex cooling systems that make the devices more expensive and even more difficult to disassemble and assemble for access to the substrate. Additionally, the plasmas formed are typically uneven (nonsymmetric), causing uneven substrate processing without the addition of some means for increasing uniformity, such as a substrate turntable that continuously moves the substrate in relation to the plasma.

Figure 1:
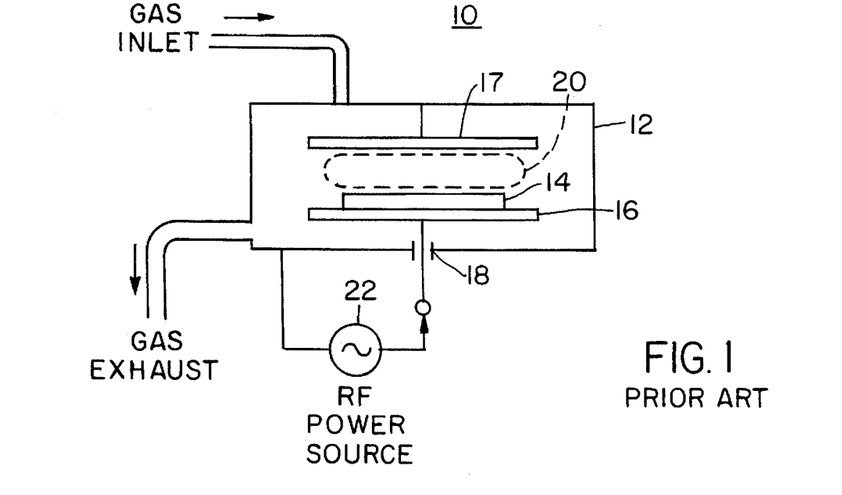
FIG. 1 is a schematic diagram of a prior art RF plasma reactor.

Because of the problems associated with microwave plasma generation, plasma processes such as etching and deposition of materials in semiconductor processing often employ a radio frequency plasma discharge sustained in a parallel plate reactor. A typical RF plasma generator is shown in FIG. 1. Reactor 10 includes chamber 12 having therein parallel plate electrodes 16 and 17. Plate 17 is electrically connected to chamber 12 which itself is on one side of RF power source 22, and the other side of RF power source 22 is electrically connected to plate 16. There is a gas inlet and gas exhaust. Plasma 20 is formed between plates 16 and 17 so that substrate 14 may be processed by plasma 20.

These RF plasma generators typically operate at frequencies of 100 KHz to 13 MHz. The reactors are much smaller in every dimension than the wavelength at the frequency of operation. For example, the wavelength at the upper range of 13 MHz is approximately 20 meters, and the electrode diameter in such reactors commonly is ½ meter or less. Additionally, the distance between the electrodes and the height and diameter of the chamber are also much less than a wavelength at the frequency of operation. Because the dimensions of these RF generators are small compared to the length of a standing wave, standing waves and their associated field distributions do not play a significant role in operation of the reactor. Because of the relative low frequency and the size limitations, however, these reactors are relatively low energy and create a relatively low density plasma which is in many instances inferior to the high density microwave plasma with regard to rate, feature definition, and damage levels. Accordingly, although RF plasma reactors are widely used and are less complex in design than traditional microwave plasma reactors and thus relatively simple to operate, they have not been able to keep up with the processing needs of the industry.

SUMMARY OF INVENTION

It is therefore an object of this invention to provide a microwave plasma reactor that creates relatively large plasmas.

It is a further object of this invention to provide such a plasma reactor which creates relatively uniform plasmas.

It is a further object of this invention to provide such a plasma reactor in which the dielectric window has an extended life.

It is a further object of this invention to provide such a plasma reactor in which there is no dielectric window-based contamination in the processing chamber.

It is a further object of this invention to provide such a plasma reactor which is easier to cool than conventional microwave plasma reactors.

It is a further object of this invention to provide such a plasma reactor which provides easier access to the substrates within the reactor.

It is a further object of this invention to provide such a plasma reactor which can operate over a larger range of pressure and power.

It is a further object of this invention to provide such a plasma reactor which can couple more power to the plasma.

It is a further object of this invention to provide such a plasma reactor which has improved temperature control of the substrate.

This invention results from the realization that a high density plasma microwave plasma reactor particularly suited for commercial semiconductor processing operations and chemical vapor deposition of diamond and other advanced materials may be accomplished with a single flat electrode in which the microwave energy is applied to the underside of the electrode and the plasma is formed on the other side of the electrode, and from the further realization that such a design may employ a dielectric window on the bottom side of the electrode and so fully shielded from the plasma to allow larger and higher temperature plasmas without adversely affecting the window or contaminating the chamber with window material.

This invention features a microwave plasma reactor including a chamber for containing a gas to be energized into a plasma with microwave energy, an electrode in the chamber having two surfaces for radiating microwave energy from one of its surfaces into the chamber to form a plasma proximate the radiating surface, and means for introducing microwave energy onto the other of the two electrode surfaces for providing the energy to form the plasma. The electrode in one embodiment is disc-shaped. The means for introducing microwave energy may include a waveguide or a coaxial conductor, in which case the center coaxial conductor is preferably electrically connected to the electrode. There may also be included a microwave waveguide for conducting microwave energy to the coaxial conductor.

The reactor may also include means for evacuating the chamber for operating at sub-atmospheric pressure. In that case, there may further be included means for sealing the chamber from the atmosphere, which may be accomplished with a dielectric seal means such as a dielectric window for allowing the microwave energy to pass therethrough. In that case, there may further be included means for sealing the dielectric seal means against the electrode, which may be accomplished with means for urging the electrode against the dielectric seal means, for example with a spring mechanically coupled to the electrode. The dielectric seal is preferably located in a relatively low electric field region, for example near the edge of the electrode on the excitation side. This also prevents the plasma-forming gas from reaching the high electric field regions closer to the center of the electrode excitation side, which keeps the plasma on the other side of the electrode.

The reactor preferably includes means for creating a relatively thin, elongated plasma proximate the electrode radiating surface. When the electrode radiating surface is flat, this may be accomplished with an uneven spacing between the electrode radiating surface and the chamber, which may itself include a generally increasing spacing from the edge toward the center of the electrode. The reactor preferably includes means for establishing a standing wave between the electrode radiating surface and the chamber.

The other of the two electrode surfaces may be spaced less than one-half of a wavelength distance from the chamber, and preferably is no more than one-quarter of a wavelength from the chamber. The electrode radiating surface may be at least one-half a wavelength distance across. The edge of the electrode radiating surface may be less than one-half of a wavelength distance from the chamber. The center of the electrode radiating surface may be less than one wavelength distance from the chamber. The chamber may include a microwave cavity. The microwave cavity may be coextensive with the chamber or smaller than and contained within the chamber. Alternatively, a portion of the cavity may extend beyond the chamber.

The invention also features a microwave plasma reactor having a chamber for containing a gas to be energized into a plasma with microwave energy and a cavity for containing a microwave field to create gas plasma. There is an electrode having two surfaces located in the cavity for radiating microwave energy from one of its surfaces to form the plasma proximate the radiating surface, and there are means for introducing microwave energy onto the other of the two electrode surfaces for providing energy to form the plasma.

In a preferred embodiment the microwave cavity may be coextensive with the chamber or smaller than and contained within the chamber. A portion of the cavity may extend beyond the chamber.

Preferably, the reactor includes means for introducing into the chamber the gas to be energized, and means for cooling the electrode which may be accomplished with means for flowing a cooling fluid through the electrode. This may be accomplished by including one or more fluid chambers within the electrode and spaced from the electrode radiating surface. In that case, there may further be included means for regulating the flow of heat from the electrode radiating surface to the cooling fluid in the fluid chamber, which may be accomplished with means for providing gas in the electrode between the cooling fluid chamber and the electrode radiating surface. There may then further be included means for varying the gas pressure to control the heat flow.

BRIEF DESCRIPTION OF THE DRAWINGS

Other objects, features and advantages will occur to those skilled in the art from the following description of a preferred embodiment and the accompanying drawings in which.

DISCLOSURE OF PREFERRED EMBODIMENTS

This invention may be accomplished in a microwave plasma reactor that includes a chamber for containing a gas to be energized into a plasma with the microwave energy. An electrode having a microwave-receiving surface and a microwave-radiating surface is provided within the chamber, and there are means for introducing microwave energy onto the microwave-receiving surface of the electrode to cause the electrode to radiate microwave energy from its radiating surface to form a plasma at or just above that surface. This arrangement allows the dielectric window to be placed on the microwave-receiving side of the electrode so that the window is shielded from the plasma by the electrode to allow higher power operation and also increase window life and do away with contamination of the reactor with window material due to plasma etching or coating of the window.

Figure 2A:
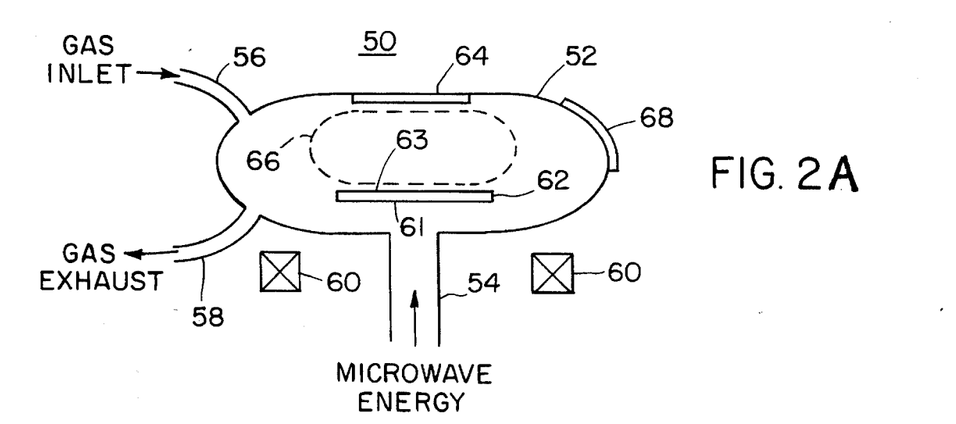
FIG. 2A is a simplified schematic diagram of a microwave plasma reactor according to this invention.
Figure 2B:
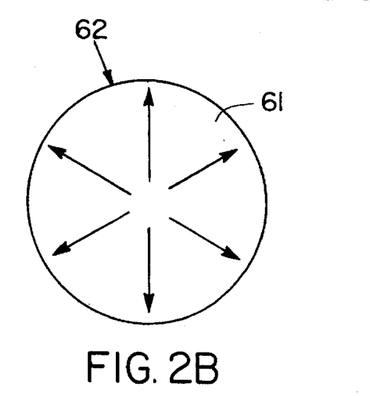
FIGS. 2B and 2C are bottom and top views, respectively, of the electrode of the reactor of FIG. 2A, illustrating the direction of flow of electromagnetic energy.
Figure 2C:
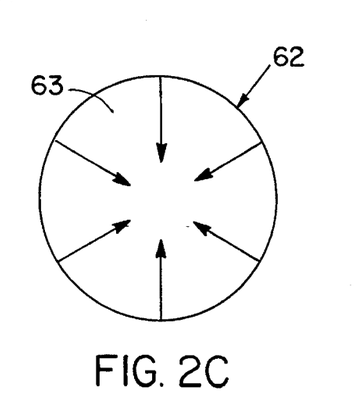

There is shown in FIGS. 2A through 2C microwave plasma reactor 50 according to this invention. Reactor 50 includes vacuum chamber 52 for containing the gas to be energized into the plasma. Gas is provided to the chamber through gas inlet port 56 and is exhausted from the chamber through exhaust port 58, which also provides a means of maintaining a desired pressure in the chamber, typically from 1 millitorr to 200 torr. Microwave energy is provided through microwave input transmission line 54. The term "microwave" is used here to refer to electromagnetic energy at frequencies greater than 300 MHz. Flat enlarged-surface electrode 62, which may be disc shaped or rectangular, for example, is placed in the path of the microwave energy entering through transmission line 54. The microwave energy travels around the underside of electrode 62, and back up around the edges and toward the middle of the top side of electrode 62 to create a microwave discharge above electrode 62 that forms plasma 66. Substrate 64 may be placed on the wall of chamber 52 proximate plasma 66 or alternatively may be placed on electrode 62. This figure also shows the use of electromagnet 60 which is used in situations in which electron cyclotron resonance is desired. Cover 68 for opening 70 in chamber 52 provides a means of access to chamber 52 from the outside so that substrate 64 may be replaced.

Generator 50 thus features one or more electrodes which are excited by microwave power from one side (the excitation side) and which scatter the power or reradiate microwave fields via currents which are induced on the electrode by the exciting fields in such a way as to produce plasma discharge on the other side (the plasma side) of the electrode or electrodes. Preferably, the sizes of the electrodes, electrode spacing from the chamber, and the chamber itself are not small compared with the wavelength at the operating frequency to take advantage of standing waves and the natural modes of electromagnetic fields in the reactor. By proper choice of dimensions of the electrode and the reactor chamber and the mode of excitation, a reactor arrangement can be achieved where the most intense electric field in the reactor volume is caused to exist in the region on the plasma side of the electrode, rather than near the source of excitation. This causes the plasma to form preferentially in the desired region on the plasma side of the electrode only, and allows a dielectric material placed in the region on the excitation side of the electrode to serve as a vacuum or pressure barrier separating the reactor volume from the microwave source. Positioning the microwave window on the excitation side in this manner causes the electrode to shield the window from the plasma, thus protecting the dielectric barrier from heating, coating and etching which would occur if the barrier were in view of the plasma.

Because the electric field strength on the excitation or underside of electrode 62 decreases with increasing radial distance from the center of the electrode where the microwave energy is coupled to the electrode, the dielectric barrier may be placed close to the edge of electrode 62 so that it is in a relatively low electric field where plasma breakdown is prevented. This is illustrated in FIGS. 2B and 2C which illustrate that the electromagnetic field on the underside 61 of electrode 62 radiates out towards the edge of the electrode, while on upper side 63 the field radiates back towards the center of the electrode to cause increasing electric field strength towards the top center for efficient plasma generation.

Figure 3A:
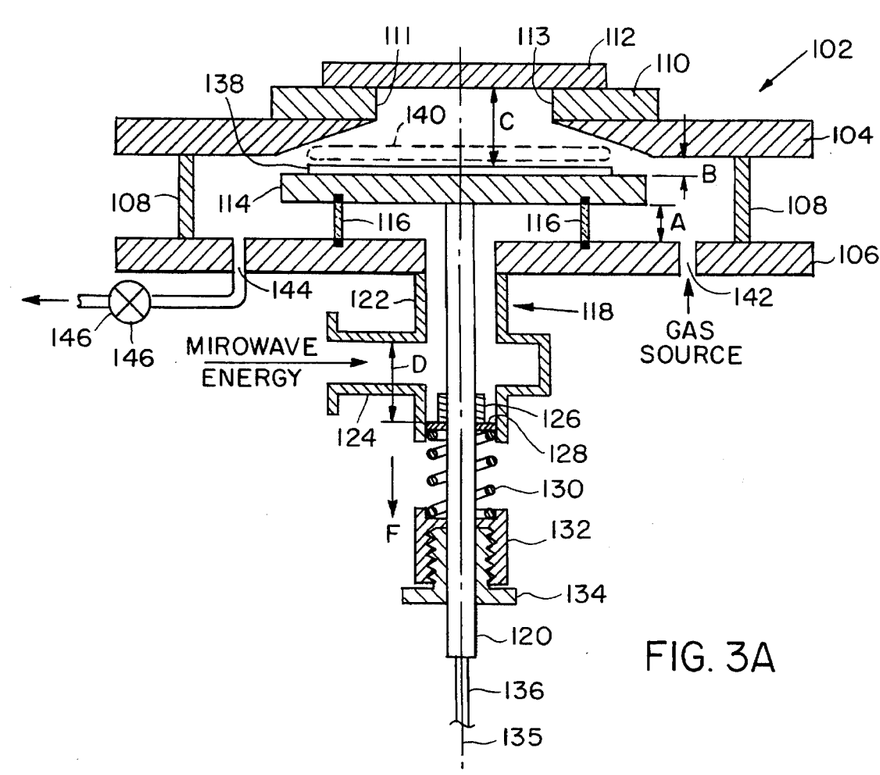
FIG. 3A is a more detailed cross sectional view of a preferred embodiment of the microwave plasma reactor of this invention.
Figure 3B:
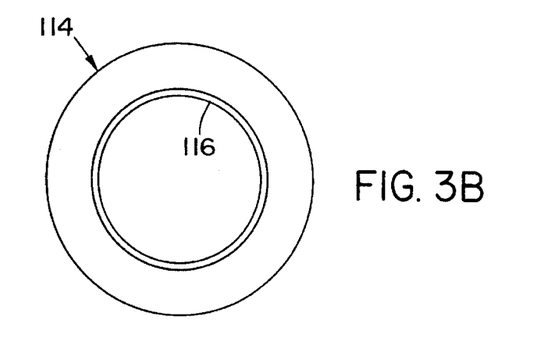
FIG. 3B is a bottom view of the substrate and dielectric window of the reactor of FIG. 3A.

A preferred form of plasma reactor 100 is shown schematically in FIGS. 3A and 3B. Reactor 100 includes reactor chamber 102 for containing the gas to be energized into a plasma with microwave energy. Gas is provided through port 142 and exhausted through port 144 by vacuum pump 146 which, in combination with standard valving of gas source 142 accomplishes control of both pressure and mass flow through the interior of chamber 102. Flat or curved upper surface electrode 114 is placed within chamber 102. Preferably, electrode 114 is a disc as best shown in the bottom view of FIG. 3B.

Microwave power is provided to the underside or excitation side of electrode 114 by a fundamental mode coaxial transmission line 118 with center conductor 120 electrically and mechanically connected to electrode 114, and outer conductor 122 joined to bottom metal plate 106 of generally cylindrical reactor chamber 102. Dielectric barrier 116 is an annular ring placed toward the outer edge of electrode 114 so that it resides where there is a relatively low electric field strength so that plasma breakdown will not occur at or near window 116 to prevent heating, coating and/or etching of the window, common in other microwave plasma reactor designs. This arrangement also keeps the gas from the higher electric field region closer to the center of the excitation side of the electrode, which assists in forming the plasma where desired on the upper side of the electrode. In this embodiment, where the center conductor is attached to the center of a round disc electrode 114, and a fundamental mode microwave is provided to waveguide 124, the electromagnetic fields are symmetric about longitudinal axis 135. The electric field strength decreases with increasing radial position as the radial wave diverges on the excitation or underside of electrode 114. On the plasma or upperside of electrode 114, the field strength will tend to increase with decreasing radial position as the wave converges on axis 135, resulting in an intensity sufficient for breakdown of the gas to form relatively thin elongated disc-shaped plasma 140.

The shape of the wall of chamber 102 facing the plasma side of electrode 114, and the spacing between the electrode and that side of the chamber, may be used to control the strength of the electric field as a function of radial position to obtain the most uniform discharge, or another desired radial electric field profile. In the embodiment shown, surfaces 111 and 113 formed by machining of plates 104 and 110 approximate a curve varying inversely with electrode radius which, to first order, keeps the electric field strength constant across most of the diameter of electrode 114 to create an axisymmetric, uniform plasma disc 140 over most of the surface of electrode 114. The size of the plasma is approximately commensurate with the size of substrate 138 placed thereon.

Annular dielectric window 116 is sealed against both plate 106 and electrode 114 using O-rings or other types of available seals. Since window 116 is subjected to a virtual vacuum towards the inside of reactor 102, and typically atmospheric pressure outside in the region of center conductor 120, it is necessary either to permanently affix window 116 to both electrode 114 and plate 106, or, preferably, to apply a downward force to electrode 114 to seat window 116 on its seals. This is accomplished in the embodiment of FIG. 3A using adjustable tension spring 130 that is fixed in some manner to center conductor 120 for applying a downward force through conductor 120 on electrode 114. In the example shown, this is accomplished by fixing spring 130 on member 128 fixed to member 120 and seating the other end of spring 130 in adjusting nut 134 that is adjusted by turning or sliding adjusting member 134 along the length of member 120. The greater the compression of spring 130, the more downward force on electrode 114. Sliding choke 126 is preferably placed at a distance D of approximately one-half wavelength from the top of waveguide 124. This sliding choke may be DC isolated from conductor 120 so that a bias may be established on electrode 114 through conductor 120.

In a preferred embodiment of the design of reactor 100, a 2.45 GHz, 5000 watt microwave source is employed at waveguide 124. This frequency has a wavelength of approximately 12 centimeters. Electrode 114 has a diameter equal to or larger than discharge or plasma 140 to keep the plasma on the upper side of electrode 114 so that window 116 is shielded. Preferably, the diameter of electrode disc 114 is greater than one-half of a wavelength, and may be approximately 22 centimeters.

It is also desired to form a standing wave between electrode 114 and the upper portion of chamber 102. For a disc substrate having a diameter of approximately one wavelength (12 centimeters) and a gap between the top of electrode 114 and the inside of the top of chamber varying approximately inversely with the electrode radius, the gap A between the bottom edge of electrode 114 and bottom plate 106 of chamber 102 may be about one-half wavelength or less, but is preferably approximately one-quarter wavelength, so a standing wave may not be established between the two metal surfaces to prevent plasma discharge from occurring proximate window 116. The gap is typically not smaller than this to prevent an increase in electric field strength that could similarly create a plasma discharge. Distance B from the top edge of electrode 116 to the top of reactor chamber 102 is also approximately one-quarter wavelength for the same reason, while distance C from the center of electrode 114 to the top of chamber 102 is kept at less than one wavelength and preferably close to one-half wavelength to establish a standing wave to increase the electric field strength in the region where it is desired to form plasma 140. In one embodiment, distance C is made adjustable by adding additional thicknesses to plate 110 having a circular opening defined between walls 111 and 113 to change the distance of top plate 112 from the top of electrode 114.

Figure 4A:
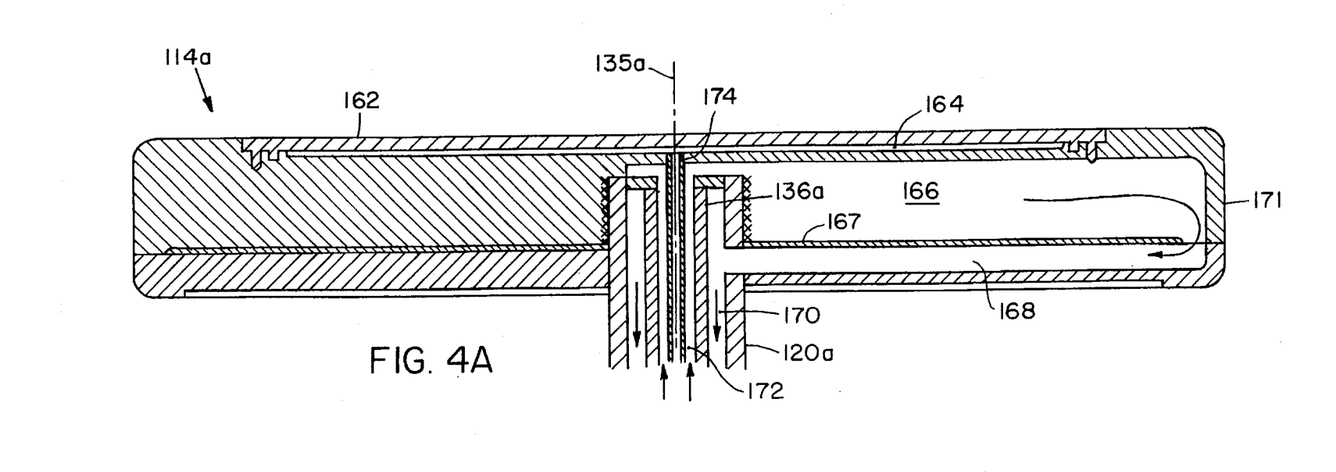
FIG. 4A is an enlarged cross sectional view of a preferred embodiment of the electrode of the reactor of FIG. 3A also detailing the means by which the electrode is cooled.

The electrode is preferably cooled, and may be provided with a means of keeping it at constant temperature as follows. Center conductor 120a, FIG. 4A, may be tubular, and may have inner tubular member 136a therein to create annular gap 170 and central gap 172. Cooling water may be provided up one of these gaps, for example gap 172 as shown, into a plurality of sector-shaped chambers 166 spaced circumferentially around axis 135a of electrode 114a. The water entering through central annular gap 172 flows into chamber 166 radially out through the chamber and then into return chamber 168 under chamber 166 and formed by plate 167 that extends radially almost to edge 171 of electrode 114a. The water then flows back out down through annular gap 170 to waste or to a heat exchanger for a recirculation system. Inner member 174 may also be hollow to provide a passageway through its middle leading to cylindrical chamber 164 machined just below substrate platen 162 for holding the substrate, not shown, on electrode 114a. The rate of heat transfer from the substrate in platen 162 into electrode 114a, and particularly the cooling water in the chamber such as chamber 166, may be controlled by providing a gas through the center opening of annular conductor 174 to fill chamber 164. The pressure of the gas may be controlled by means such as the gas source, a throttle valve, and an exhaust pump to control the rate of heat transfer through the gaseous medium to effectively control the heat transfer away from the substrate. In this manner, the temperature of the substrate can be more exactly controlled, particularly if the temperature of the substrate is measured with a pyrometer or another means such as a thermocouple embedded in the substrate or substrate platen 162.

Figure 4B:
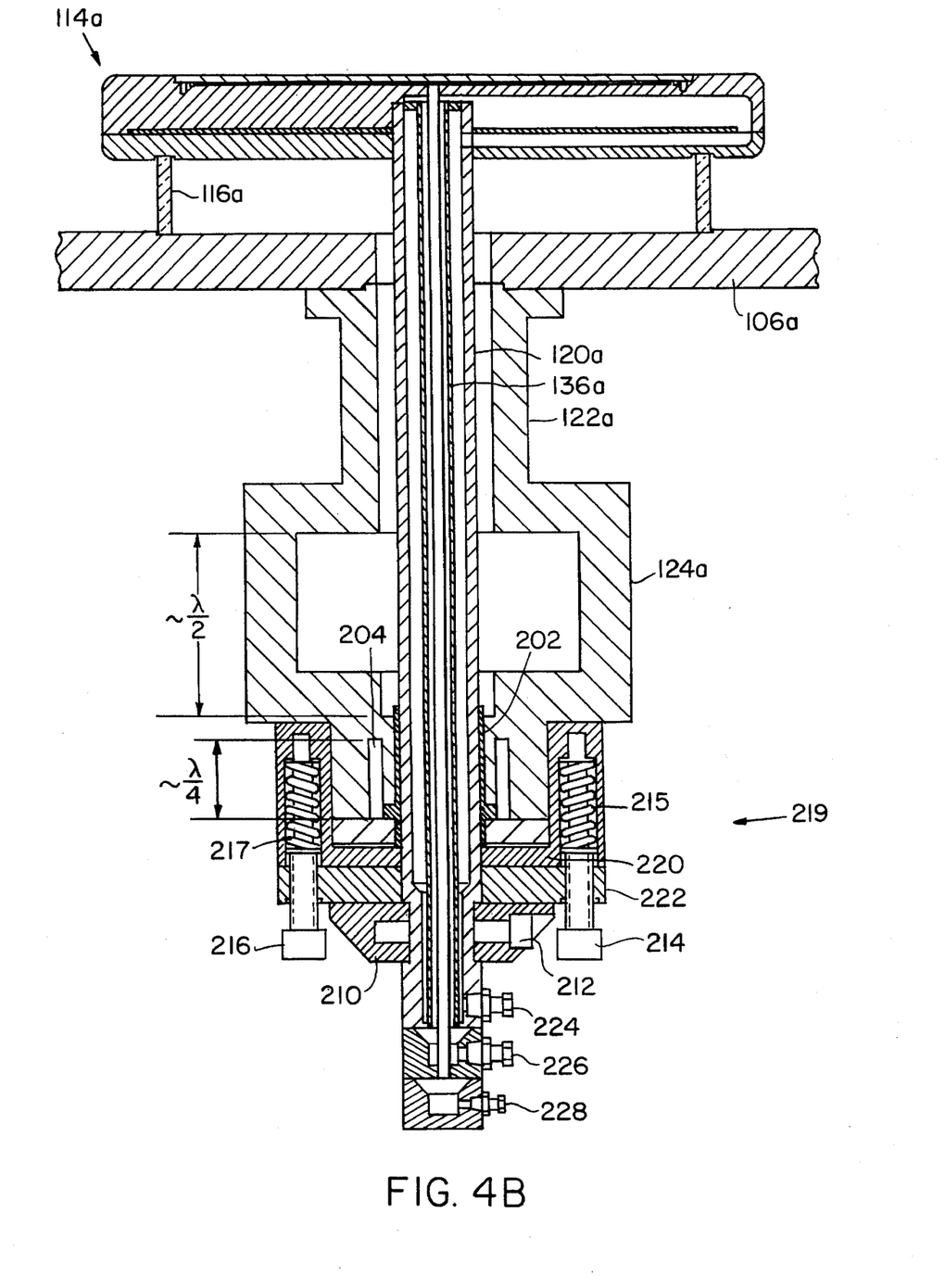
FIG. 4B is a more detailed cross-sectional view of a preferred form of the choke and the spring adjustment mechanism of the reactor of FIG. 3A.

FIG. 4B details a preferred form of the choke and the spring adjustment mechanism of the reactor of FIG. 3A. Electrode 114a is urged against window 116a to seal the window against both the electrode and bottom plate 106a by spring adjustment mechanism 219. Mechanism 219 includes a number of springs such as springs 217 and 215 spaced circumferentially around inner conductor 120a. Adjustment screws 214 and 216 associated with springs 215 and 217, respectively, allow the adjustment of the loading force on the springs. Clamp ring 210 held in place by bolt 212 transfers the spring load from the several springs to central conductor 120a for applying a downward urging force on electrode 114a as described above. Force is transferred to member 210 through member 222 which threadably receives the spring adjustment screws.

The choke assembly for waveguide 124a includes annular insulating sleeve 202 that may be made of a material such as a fluorocarbon polymer. Annular choke groove 204 has a height of approximately one-fourth of a wavelength. Electrode cooling and substrate temperature control as described above is accomplished using water inlet 226 and outlet 224, and fitting 228 for supplying a gas for temperature control as described above.

Figure 5A:
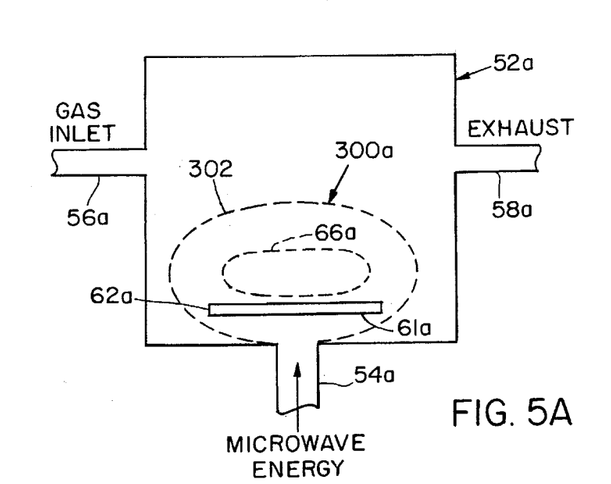
FIG. 5A is a simplified schematic diagram of a microwave plasma reactor according to this invention in which the microwave cavity is included in the vacuum chamber.
Figure 5B:
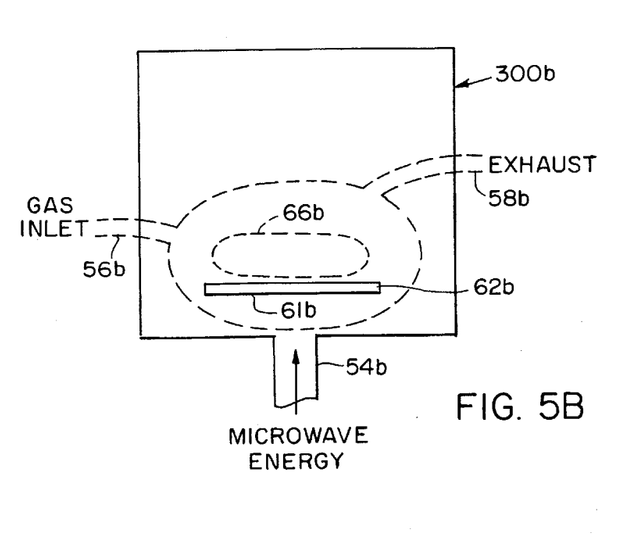
FIG. 5B is a view similar to FIG. 5A wherein the vacuum chamber is included at least partially within the microwave cavity.

Although thus far the chambers 52 and 102 have functioned as both the vacuum chamber for the gas to be energized into a plasma and the microwave cavity where the microwave energy creates the gas plasma, this is not a necessary limitation of the invention. For while the chamber and cavity may be coextensive as shown in FIGS. 2A and 3A, they need not be. Chamber 52a, FIG. 5A, may contain within it microwave cavity 300 formed by a gas permeable microwave boundary w/such as a metal mesh 302. Alternatively, the cavity 300b, FIG. 5B, may extend beyond the chamber 52b. Cavity 300b may be a microwave permeable, gas boundary such as constituted by a quartz vessel.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A microwave plasma reactor, comprising:

a chamber for containing a gas to be energized into a plasma with microwave energy;

a cavity for containing a microwave field to create the gas plasma;

an electrode having two surfaces and located in said cavity for radiating microwave energy from one of its surfaces to form the plasma proximate said electrode radiating surface; and means for introducing microwave energy onto the other of the two electrode surfaces, said microwave energy passing around the other of the two electrode surfaces and proximate said electrode radiating surface for creating a microwave discharge to form the plasma.

2. The microwave plasma reactor of claim 1 in which said microwave cavity is coextensive with said chamber.

3. The microwave plasma reactor of claim 1 in which said microwave cavity is smaller than and contained within said chamber.

4. The microwave plasma reactor of claim 1 in which a portion of said cavity extends beyond said chamber.

5. The microwave plasma reactor of claim 1 in which said electrode is disk-shaped.

6. The microwave plasma reactor of claim 1 in which said means for introducing microwave energy includes a coaxial conductor.

7. The microwave plasma reactor of claim 6 in which the coaxial conductor is electrically connected to said electrode.

8. The microwave plasma reactor of claim 6 in which said means for introducing microwave energy includes a microwave waveguide for conducting microwave energy to said coaxial conductor.

9. The microwave plasma reactor of claim 1 further including means for evacuating said chamber for operating at sub-atmospheric pressure.

10. The microwave plasma reactor of claim 9 further including means for sealing said chamber from the atmosphere.

11. The microwave plasma reactor of claim 10 in which said means for sealing said chamber includes dielectric seal means for allowing microwave energy to pass therethrough.

12. The microwave plasma reactor of claim 11 in which said means for sealing said chamber further includes means for sealing said dielectric seal means against said electrode.

13. The microwave plasma reactor of claim 12 in which said means for sealing said dielectric seal means against said electrode includes means for urging said electrode against said dielectric seal means.

14. The microwave plasma reactor of claim 13 in which said means for urging includes spring means mechanically coupled to said substrate.

15. The microwave plasma reactor of claim 11 in which said dielectric seal means is located in a low electric field region.

16. The microwave plasma reactor of claim 15 in which said dielectric seal means is proximate the edge of said electrode at the other electrode surface to exclude the plasma-forming gas from the high electric field regions closer to the center of the electrode, to inhibit plasma formation proximate the other electrode surface.

17. The microwave plasma reactor of claim 1 further including means for creating a thin, elongated plasma proximate said electrode radiating surface.

18. The microwave plasma reactor of claim 17 in which said electrode radiating surface is flat.

19. The microwave plasma reactor of claim 17 in which said means for creating a thin, elongated plasma includes an uneven spacing between said electrode radiating surface and said chamber.

20. The microwave plasma reactor of claim 19 in which said uneven spacing includes a generally increasing spacing from the edge toward the center of said electrode.

21. The microwave plasma reactor of claim 1 in which said electrode radiating surface is at least one half of a wavelength distance across.

22. The microwave plasma reactor of claim 1 in which the edge of said electrode radiating surface is less than one half of a wavelength distance from said chamber.

23. The microwave plasma reactor of claim 1 in which the center of said other of the two electrode surface is less than one wavelength distance from said chamber.

24. The microwave plasma reactor of claim 1 further including means for introducing into said chamber the gas to be energized.

25. The microwave plasma reactor of claim 1 further including means for cooling said electrode.

26. The microwave plasma reactor of claim 25 in which said means for cooling said electrode includes means for flowing a cooling fluid through said electrode.

27. The microwave plasma reactor of claim 26 in which said means for flowing a cooling fluid through said electrode includes a fluid chamber within said electrode and spaced from said electrode radiating surface.

28. The microwave plasma reactor of claim 27 further including means for regulating the flow of heat from said electrode radiating surface to the cooling fluid in said fluid chamber.

29. The microwave plasma reactor of claim 28 in which said means for regulating the flow of heat includes means for providing a gas in said electrode between said cooling fluid chamber and said electrode radiating surface.

30. The microwave plasma reactor of claim 29 in which said means for regulating the flow of heat includes means for varying the gas pressure.

31. The microwave plasma reactor of claim 1 further including means for establishing a standing wave between said electrode radiating surface and said chamber.

32. The microwave plasma reactor of claim 1 in which the other of the two said electrode surfaces is spaced less than one half of a wavelength distance from said chamber.

33. The microwave plasma reactor of claim 32 in which the other of the two said electrode surfaces is spaced no more than one quarter of a wavelength distance from said chamber.

34. A microwave plasma reactor, comprising:

a chamber for containing a gas to be energized into a plasma with microwave energy;

a cavity for containing a microwave field to create the gas plasma;

an electrode having two surfaces and located in said cavity for radiating microwave energy from one of its surfaces to form the plasma proximate said electrode radiating surface;

means introducing microwave energy onto the other of the two electrode surfaces for providing the energy to form the plasma; and means for cooling the electrode.

35. The microwave plasma reactor of claim 34 in which said means for cooling said electrode includes means for flowing a cooling fluid through said electrode.

36. A microwave plasma reactor, comprising:

a chamber for containing a gas to be energized into a plasma with microwave energy;

a cavity for containing a microwave field to create the gas plasma;

an electrode having two surfaces and located in said cavity for radiating microwave energy from one of its surfaces to form the plasma proximate said electrode radiating surface;

means for introducing microwave energy onto the other of the two electrode surfaces for providing the energy to form the plasma;

means for creating a relatively thin, elongated plasma proximate said electrode radiating surface, said means including an uneven spacing between said electrode radiating surface and said chamber.

37. The microwave plasma reactor of claim 36 in which said electrode radiating surface is flat.

38. The microwave plasma reactor of claim 36 in which said uneven spacing includes a generally increasing spacing from the edge toward the center of said electrode.

39. A microwave plasma reactor, comprising:

a chamber for containing a gas to be energized into a plasma with microwave energy;

a cavity for containing a microwave field to create the gas plasma;

an electrode having two surfaces and located in said cavity for radiating microwave energy from one of its surfaces to form the plasma proximate said electrode radiating surface;

means for introducing microwave energy onto the other of the two electrode surfaces for providing the energy to form the plasma;

dielectric seal means for sealing the chamber from atmosphere and allowing microwave energy to pass therethrough; and spring means mechanically coupled to the electrode for urging said electrode against said dielectric seal means.

40. The microwave plasma reactor of claim 39 in which said dielectric seal means is located in a low electric field region.

41. The microwave plasma reactor of claim 40 in which said dielectric seal means is proximate the edge of said electrode at the other electrode surface to exclude the plasma-forming gas from the high electric field regions closer to the center of the electrode, to inhibit plasma formation proximate the other electrode surface.

\* \* \* \* \*